United States Patent [19]

Oyamatsu

[11] Patent Number: 5,691,564

[45] Date of Patent: Nov. 25, 1997

[54] SEMICONDUCTOR DEVICE WITH HIGH SPEED OPERATION AND HIGH INTEGRATION

[75] Inventor: Hisato Oyamatsu, Kawasaki, Japan

[73] Assignee: Kabushiki Kaisha Toshiba, Tokyo, Japan

[21] Appl. No.: 566,490

[22] Filed: Dec. 4, 1995

Related U.S. Application Data

[63] Continuation of Ser. No. 212,108, Mar. 11, 1994, abandoned.

[30] Foreign Application Priority Data

Mar. 11, 1993 [JP] Japan .................................. 5-050955

[51] Int. Cl.$^6$ .................. H01L 29/00; H01L 27/108; H01L 29/76
[52] U.S. Cl. .................. 257/509; 257/506; 257/524; 257/305; 257/395
[58] Field of Search .................. 257/305, 395, 257/398, 399, 400, 506, 509, 524

[56] References Cited

U.S. PATENT DOCUMENTS

| | | |
|---|---|---|
| 4,604,790 | 8/1986 | Bonn . |
| 5,065,208 | 11/1991 | Shah et al. .................. 257/370 |
| 5,107,321 | 4/1992 | Ilderem et al. .................. 257/274 |
| 5,116,775 | 5/1992 | Katto et al. .................. 437/26 |
| 5,119,162 | 6/1992 | Todd et al. .................. 257/273 |
| 5,128,274 | 7/1992 | Yabu et al. . |
| 5,173,438 | 12/1992 | Sandhu . |
| 5,428,239 | 6/1995 | Okamura et al. .................. 257/371 |
| 5,510,637 | 4/1996 | Hsu et al. .................. 257/304 |

OTHER PUBLICATIONS

T. Ikeda, et al., "Advanced BiCMOS Technology for HIgh Speed VLSI", IEEE 1986.

Primary Examiner—Tom Thomas
Assistant Examiner—Fetsum Abraham
Attorney, Agent, or Firm—Loeb & Loeb LLP

[57] ABSTRACT

A semiconductor device manufactured by isolating an element by forming an insulating film on the surface of a semiconductor substrate at an element isolation region, selectively forming a resist film at a second region on the surface of the semiconductor substrate by photolithography, high speed operation having priority over high integration in the second region, and selectively implanting impurity ions as a channel stopper in a first region by using the resist film as a mask, high integration having priority over high speed operation in the first region.

12 Claims, 2 Drawing Sheets

SEMICONDUCTOR DEVICE WITH HIGH SPEED OPERATION AND HIGH INTEGRATION

This is a continuation of application Ser. No. 08/212,108, filed Mar. 11, 1994, now abandoned.

BACKGROUND OF THE INVENTION a) Field of the Invention

The present invention relates to a method of manufacturing a semiconductor device.

b) Description of the Related Art

For high integration of semiconductor elements, techniques of miniaturizing elements and isolating elements in fine regions have become important. According to the recent technique, a field oxide film is formed in an element isolation region and impurities of the same conductivity type as of a well are implanted as a channel stopper. It is necessary to set the impurity concentration to have a peak at the position just under the field oxide film in the depth direction. Field ions are implanted to have such an impurity concentration distribution after the field oxide film was formed, it is therefore possible to prevent impurities from being diffused by a thermal process for forming the field oxide film, and to improve the controllability of impurity concentration distribution. An element isolation method relevant to the background of the present invention will be described with reference to FIGS. 2(a)–2(e).

As shown in FIG. 2(a), boron ions (B$^+$) or the like are implanted on the surface of a semiconductor substrate 101 at a predetermined impurity concentration to form a p-type well 115. A thermal oxide film 102 is formed thereon by thermal oxidation. A polycrystalline silicon film 103, a silicon nitride film 104, and a polycrystalline silicon film 105 are formed in this order on the thermal oxide film 102 by CVD to thicknesses of about 1000 angstroms, about 2000 angstroms, and about 3000 angstroms, respectively. A resist film 106 covering element regions is formed on the polycrystalline silicon film 105 by photolithography. By using the resist film 106 as a mask, the exposed polycrystalline silicon film 105 is anisotropically ion-etched, and the remaining polycrystalline silicon film 105 is thermally oxidized to form a thick silicon oxide film 107 as shown in FIG. 2(b). By using the silicon oxide film 107 as a mask, the silicon nitride film 104 is anisotropically ion-etched to the intermediate depth of the polycrystalline silicon film 103. Thereafter, the silicon oxide film 107 is removed by using ammonium fluoride (NH$_4$F).

AS shown in FIG. 2(c), element isolation regions of the semiconductor substrate 101 are oxidized to form a field oxide film 108.

After the silicon nitride film 104a and polycrystalline silicon film 103a shown in FIG. 2(c) are removed by chemical dry etching (CDE) and the thermal oxide film 102 is etched by NH$_4$F, a silicon oxide film 109 having a thickness of about 120 angstroms is formed by thermal oxidation as shown in FIG. 2(d). In order to isolate elements, boron ions (B$^+$) are implanted at an acceleration voltage of 160 keV and a dose of $2*10^{13}$ cm$^{-2}$. As described earlier, ion implantation is controlled so as to have a peak impurity concentration just under the field oxide film 108.

As shown in FIG. 2(e), a gate oxide film 111 is formed on the surface of element regions, and gate electrodes 112 are formed on the gate oxide film 111. Impurity ions are implanted to form impurity regions 113 forming drains and sources. Wiring layers (not shown) are formed by a metallizing process or the like to complete a semiconductor device.

This element isolation method is however associated with the following problems. Since field ions are implanted after the field oxide film 108 was formed, it is not possible to form in a self-alignment manner the field oxide film 108 and an impurity region 110 to be formed by field ion implantation. From this reason, field ions are implanted into both the element isolation region and element region. AS a result, field ions implanted into the element region increase the impurity concentration of the element region, thereby lowering the breakdown voltage.

Field ions are implanted deep just under the field oxide film as described earlier. However, these impurity ions are diffused near to the channel region at later processing steps such as during a thermal diffusion processing step. Therefore, the impurity concentration of the channel region in the element region increases, thereby changing a threshold voltage. This increase of the impurity concentration beneath source/drain 113 in the element region increases the capacitance between source/drain 113 and p-type well 115, lowering the operation speed of the device.

SUMMARY OF THE INVENTION

It is an object of the present invention to provide a method of manufacturing a semiconductor device capable of improving a breakdown voltage while meeting the contradictory requirements of high integration and improved operation speed.

According to the present invention, there is provided a method of manufacturing a semiconductor device having the steps of isolating an element by forming an insulating film on the surface of a semiconductor substrate at an element isolation region, selectively forming a resist film at a second region on the surface of the semiconductor substrate by photolithography, high speed operation having a priority over high integration in the second region, and selectively implanting impurity ions as a channel stopper in a first region by using the resist film as a mask, high integration having a priority over high speed operation in the first region.

Impurity ions for a channel stopper are not implanted over the whole surface of a semiconductor substrate, but they are selectively implanted only into the first region preferential to high integration without being implanted into the second region preferential to high speed operation. Since impurity ions are not implanted in the second region, the impurity concentration of an element region will not increase, thereby reducing the capacitance between sources/drains and well, speeding up the operation speed, and improving a breakdown voltage of drain. Furthermore, an electric field near a drain can be relaxed, thereby suppressing the generation of hot carriers and improving the reliability of the semiconductor device.

On the other hand, since impurity ions are implanted in the first region, the function as a channel stopper is enhanced. That is to say, even if the width of an insulating film is made narrower in the first region, there occurs no practical problem, contributing to high integration.

Use of a wider insulating film in the second region without impurity ion implantation ensures a necessary function as a channel stopper. Reducing the capacitance between source/drain and well allows high speed operation. Use of a narrower insulating film in the first region with impurity ion implantation provides high integration.

DETAILED DESCRIPTION OF THE PREFERRED EMBODIMENTS

An embodiment of the present invention will be described with reference to the accompanying drawings.

FIG. 1 shows cross sectional views of a semiconductor device obtained at processing steps of a method of manufacturing a semiconductor device according to an embodiment of the present invention. The processing steps up to forming a field oxide film 108 are the same as described with FIGS. 2(a) to 2(c), and so the description is omitted. In this embodiment, however, the width X1 of a field oxide film 202 formed in a region (I) necessary for high integration is made narrower, and the width X2 of a field oxide film 203 formed in a region (II) having a priority of high speed operation over high integration is made wider. Field ions as a channel stopper are implanted into the region (I), and not implanted into the region (II).

Figure 1A:
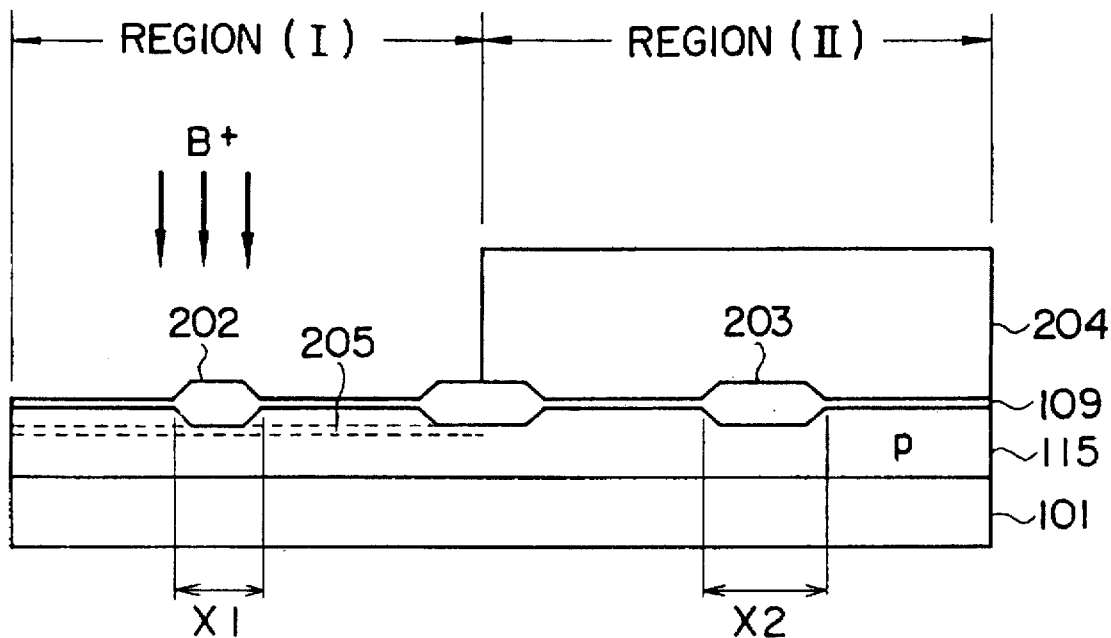
FIGS. 1(a) and 1(b) are cross sectional views explaining processing steps of a method of manufacturing a semiconductor device according to an embodiment of the present invention.
Figure 2A:
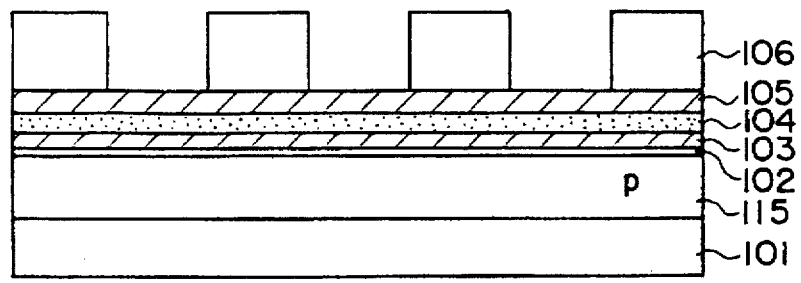
FIG. 2(a) to 2(e) are cross sectional views explaining processing steps of a semiconductor device manufacturing method relevant to the background of the present invention.
Figure 2B:
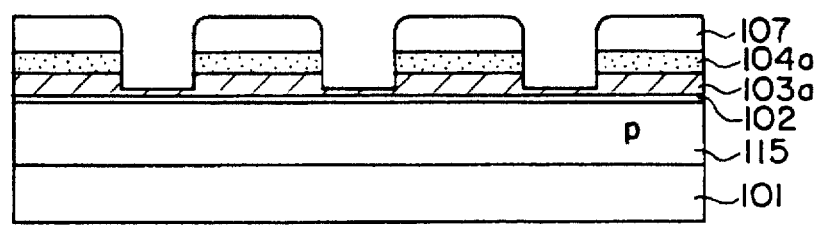
Figure 2C:
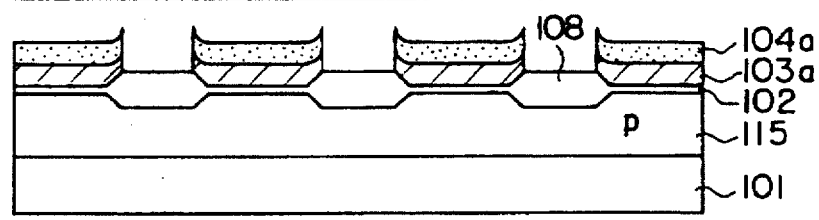
Figure 2D:
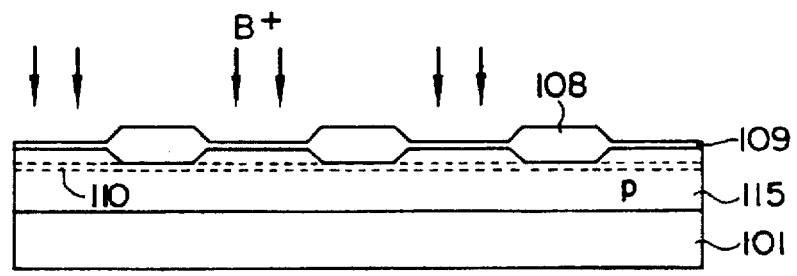
Figure 2E:
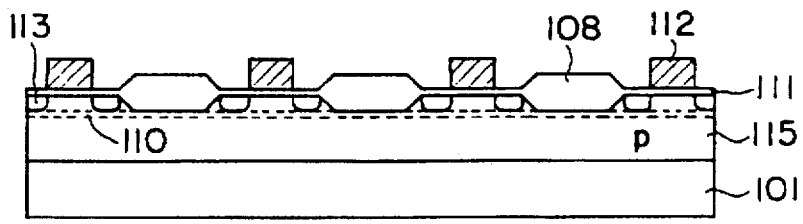

After The field oxide films 202 and 203 are formed, a resist film 204 covering only the region (II) is formed by photolithography as shown in FIG. 1(a). By using this resist film 204 as a mask, p-type impurity ions, for example, boron ions (B$^+$), are implanted only into the region (I) under the conditions of, for example, an acceleration voltage of 160 keV and a dose of $2*10^{13} cm^{-2}$. An impurity layer 205 for preventing element isolation is therefore formed just under the field oxide film 202.

Figure 1B:
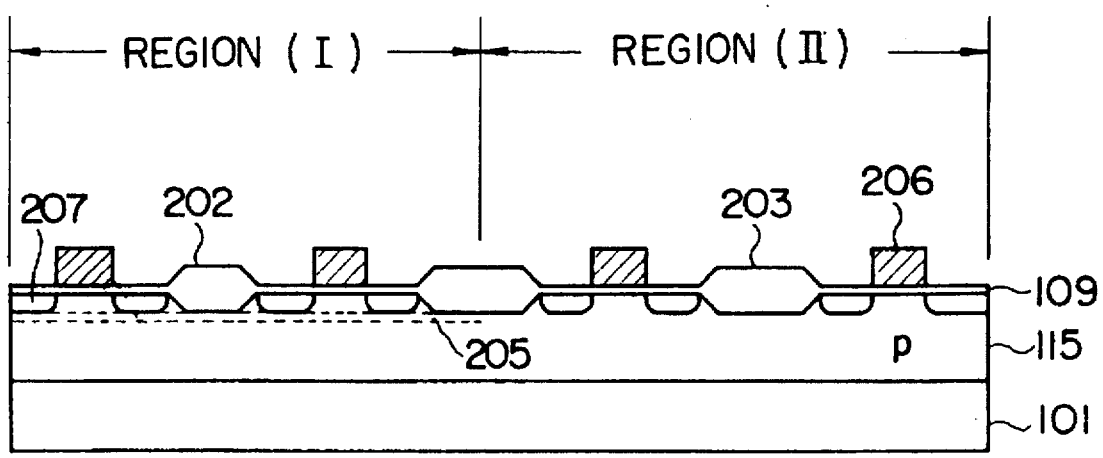

Thereafter, as shown in FIG. 1(b), a gate oxide film 109 is formed and polycrystalline silicon or the like is deposited and patterned to form a gate electrode 206 having a desired shape. Impurity ions are implanted to form source/drain 207, and wiring layers (not shown) are formed.

In this manner, field ions are implanted only into a necessary region so as to meet the contradictory requirements of high integration and high operation speed. Of semiconductor memory devices, circuits such as memory cells, decoders, and sense amplifiers have a priority of high integration over high speed operation. In the region (I) preferential to high integration, the width X1 of the field oxide film 202 is made narrower, e.g., 0.7 μm, and field ions are implanted for element isolation.

Implanted field ions raise also the impurity concentration of a channel region in an element region, thereby deepening a threshold voltage and contributing to reduce leakage current. By using this phenomenon, it becomes possible to substantially equalize the threshold voltages of elements having different thicknesses of gate oxide films to thereby speed up the total operation speed.

On the other hand, in the region (II) where semiconductor memory devices, circuits such as input/output buffers have a priority of operation speed over high integration are formed, the width X2 of the field oxide film 203 is made wider, e.g., 1.5 μm, so that element isolation can be obtained without implanting field ions.

Therefore, the impurity concentration beneath source/drain in an element region does not increase and the capacitance between source/drain and well does not increase, thereby speeding up the operation speed. Furthermore, since the impurity concentration beneath source/drain in the element region is prevented from being increased, a breakdown voltage can be improved. Still further, since the impurity concentration beneath source/drain is reduced by not implanting field ions, a concentration of an electric field near a drain can be relaxed. As a result, the generation of hot carriers can be suppressed, providing a MOS transistor of high reliability.

The above embodiment is only illustrative, and does not limit the scope of the present invention. For example, although an n-channel MOS transistor has been used in the above embodiment, the invention is also applicable to forming a p-channel MOS transistor.

What is claimed is:

1. A semiconductor device comprising:

a semiconductor substrate having a first region having a first surface and a second region having a second surface, said first region being adjacent to said second region;

first MOS transistors formed in the first region;

a first insulating film formed on the first surface of the semiconductor substrate for isolating the first MOS transistors from each other, the first insulating film having a first width between the first MOS transistors;

second MOS transistors formed in the second region;

a second insulating film formed on the second surface of the semiconductor substrate for isolating the second MOS transistors from each other, the second insulating film having a second width between the second MOS transistors, wherein the second width of the second insulating film is wider than the first width of the first insulating film; and a channel stopper region formed only in the first region by selectively implanting impurity ions through the first insulating film only in the first region, wherein the channel stopper region is isolated from the second MOS transistors in the second region.

2. The semiconductor device according to claim 1, wherein the first MOS transistors formed in the first region include at least one set of elements selected from the group consisting of memory cells, decoders, and sense amplifiers.

3. The semiconductor device according to claim 1, wherein the first width of the first insulating film is less than or equal to about 0.7 μm, and the second width of the second insulating film is equal to or greater than about 1.5 μm.

4. The semiconductor device according to claim 1, wherein high speed operation has priority over high integration in the second region and high integration has priority over high speed operation in the first region.

5. A semiconductor device comprising:

a semiconductor substrate having a first region having a first surface and a second region having a second surface, said first region being adjacent to said second region;

first and second circuit elements formed in the first region;

a first element isolation region including a first insulating film formed on the first surface of the semiconductor substrate for isolating the first and second circuit elements, the first element isolation region having a first width X1 between the first and second circuit elements;

third and fourth circuit elements formed in the second region;

a second element isolation region including a second insulating film formed on the second surface of the semiconductor substrate for isolating the third and fourth circuit elements, the second element isolation region having a second width X2 between the third and fourth circuit elements, wherein the second width X2 of the second element isolation region is wider than the first width X1 of the first element isolation region; and a channel stopper region formed only in the first region by selectively implanting impurity ions only in the first region through the first element isolation region, wherein the channel stopper region is isolated from the third and fourth circuit elements in the second region.

6. The semiconductor device according to claim 5, wherein at least one of the first and second circuit elements formed in the first region includes a memory cell.

7. The semiconductor device according to claim 5, wherein at least one of the first and second circuit elements formed in the first region includes a decoder.

8. The semiconductor device according to claim 5, wherein at least one of the first and second circuit elements formed in the first region includes a sense amplifier.

9. The semiconductor device according to claim 5, wherein the first width X1 of the first element isolation region is less than or equal to about 0.7 µm, and the second width X2 of the second element isolation region is equal to or greater than about 1.5 µm.

10. The semiconductor device according to claim 5, wherein high speed operation has priority over high integration in the second region and high integration has priority over high speed operation in the first region.

11. The semiconductor device according to claim 5, wherein at least one of the third and fourth circuit elements formed in the second region includes an input buffer.

12. The semiconductor device according to claim 5, wherein at least one of the third and fourth circuit elements formed in the second region includes an output buffer.

* * * * *